United States Patent
Maejima et al.

(10) Patent No.: US 8,391,047 B2
(45) Date of Patent: Mar. 5, 2013

(54) METHOD OF EXECUTING A FORMING OPERATION TO VARIABLE RESISTANCE ELEMENT

(75) Inventors: Hiroshi Maejima, Chuo-ku (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 304 days.

(21) Appl. No.: 12/721,092

(22) Filed: Mar. 10, 2010

(65) Prior Publication Data

US 2010/0232208 A1 Sep. 16, 2010

(30) Foreign Application Priority Data

Mar. 16, 2009 (JP) .................................. 2009-063267

(51) Int. Cl.
*G11C 11/00* (2006.01)
(52) U.S. Cl. .................... 365/148; 365/158; 365/163
(58) Field of Classification Search .............. 365/148, 365/158, 163, 189.09, 203
See application file for complete search history.

(56) References Cited

U.S. PATENT DOCUMENTS

| | | | | |
|---|---|---|---|---|
| 7,940,554 B2 * | 5/2011 | Scheuerlein et al. | ......... | 365/163 |
| 8,054,679 B2 * | 11/2011 | Nakai et al. | ................... | 365/163 |
| 2009/0244953 A1 | 10/2009 | Maejima | | |

FOREIGN PATENT DOCUMENTS

| JP | 2007-226883 | 9/2007 |
|---|---|---|
| JP | 2010-218603 | 9/2010 |

OTHER PUBLICATIONS

U.S. Appl. No. 13/187,891, filed Jul. 21, 2011, Maejima.
Office Action issued Jul. 19, 2011 in Japanese patent Application No. 2009-063267 (with English transition).

* cited by examiner

*Primary Examiner* — David Lam
(74) *Attorney, Agent, or Firm* — Oblon, Spivak, McClelland, Maier & Neustadt, L.L.P.

(57) ABSTRACT

A method of executing a forming operation to a variable resistance element to render a resistance value of the variable resistance element capable of transition, the variable resistance element being included in a memory cell connected between a first wiring and a second wiring and changing the resistance value by electrical control, comprises applying a voltage required to execute the forming operation to the variable resistance element between the first and second wirings and changing the first wiring to a floating state.

18 Claims, 9 Drawing Sheets

METHOD OF EXECUTING A FORMING OPERATION TO VARIABLE RESISTANCE ELEMENT

CROSS REFERENCE TO RELATED APPLICATIONS

This application is based upon and claims the benefit of priority from prior Japanese Patent Application No. 2009-63267, filed on Mar. 16, 2009, the entire contents of which are incorporated herein by reference.

BACKGROUND OF THE INVENTION

1. Field of the Invention

The present invention relates to a method of executing a forming operation to render a resistance value of a variable resistance element capable of transition in a non-volatile semiconductor memory device that uses the variable resistance element whose resistance value is changed by electrical control as a memory cell.

2. Description of the Related Art

In recent years, as a technology for reducing the size of a memory cell, a resistive memory has been proposed which uses a variable resistance element as a memory cell. The variable resistance elements include, for example, a phase change memory element whose resistance value is changed by a variation in state between a crystal state and an amorphous state of a chalcogenide compound, an MRAM element whose resistance value is changed by a tunnel magnetoresistive effect, a memory element of a polymeric ferroelectric RAM (PFRAM) whose resistive element is formed by a conductive polymer, and a ReRAM element whose resistance value is changed by an electric pulse applied.

The variable resistance elements used in ReRAM is divided broadly into two types: one is the type where a resistance change occurs depending on the absence or presence of electric charges trapped by a charge trapping residing on the electrode interface; and the other is the type where a resistance change occurs depending on the absence or presence of a conductive path due to oxygen defect, etc.

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner.

For unipolar-type ReRAM, data is written to a memory cell by applying, for a short period of time, a certain voltage to a variable resistance element. As a result, the variable resistance element changes from a high resistance state to a low resistance state. The operation of changing a variable resistance element from a high resistance state to a low resistance state is hereinafter referred to as the "set operation". On the other hand, data is erased from a memory cell MC by applying, for a long period of time, a certain voltage that is lower than that applied in the set operation to a variable resistance element in its low resistance state after the set operation. As a result, the variable resistance element changes from a low resistance state to a high resistance state. The operation of changing a variable resistance element from a low resistance state to a high resistance state is hereinafter referred to as the "reset operation".

The variable resistance element is in a permanent high resistance state in which the resistance value thereof is not changed immediately after the resistive memory is manufactured. It is necessary to perform a forming operation for forming a current path in an initial process, in order to perform the set operation and the reset operation on the variable resistance element. In general, the forming operation is performed by applying a voltage stress higher than a set voltage and a reset voltage to the memory cell in the wafer before a test process. When the forming operation is completed, the resistance value of the variable resistance element is reduced, which results in a rapid increase in current flowing through the variable resistance element. Therefore, in the forming process according to the related art, a tester is used to monitor the current flowing through the variable resistance element and the forming process stops when the current is rapidly increased (Japanese Patent Application Laid-Open No. 2008-227267, Paragraph Nos. 0028 and 0034). Therefore, a circuit for monitoring the current and stopping the forming process is needed.

SUMMARY OF THE INVENTION

According to an aspect of the present invention, there is provided a method of executing a forming operation to a variable resistance element to render a resistance value of the variable resistance element capable of transition, the variable resistance element being included in a memory cell connected between a first wiring and a second wiring and changing the resistance value by electrical control, the method including: applying a voltage required to execute the forming operation to the variable resistance element between the first and second wirings and changing the first wiring to a floating state.

According to another aspect of the present invention, there is provided a method of executing a forming operation to a variable resistance element in a non-volatile semiconductor memory device to render a resistance value of the variable resistance element capable of transition, the non-volatile semiconductor memory device including a plurality of first wirings, a plurality of second wirings intersecting the first wirings, and a plurality of memory cells provided at intersections of the first and second wirings and connected between the first and second wirings, each of the memory cells including the variable resistance element whose resistance value is changed by electrical control and storing the resistance value as non-volatile data, the method including: applying a first voltage to a plurality of selected first wirings among the plurality of first wirings; applying a second voltage to a plurality of non-selected first wirings adjacent to the selected first wirings among the plurality of first wirings; applying a third voltage to a selected second wiring among the plurality of second wirings such that a voltage required to execute the forming operation to the variable resistance element is applied between the selected first wirings and the selected second wiring; applying a fourth voltage to a plurality of non-selected second wirings among the plurality of second wirings so as not to cause the forming operation of the variable resistance element and a change in the resistance value of the variable resistance element between the first wirings and the non-selected second wirings; and changing the plurality of selected first wirings to a floating state, with the plurality of non-selected first wirings maintained at the second voltage, when the third voltage is applied to the selected second wiring.

According to still another aspect of the present invention, there is provided a method of executing a forming operation to a variable resistance element in a non-volatile semiconductor memory device to render a resistance value of the variable resistance element capable of transition, the non-volatile semiconductor memory device including a plurality of first wirings, a plurality of second wirings intersecting the first wirings, and a plurality of memory cells provided at intersections of the first and second wirings and connected between the first and second wirings, each of the memory cells including the variable resistance element whose resistance value is changed by electrical control and storing the resistance value as non-volatile data, the method including: applying a first voltage to a plurality of selected first wirings among the plurality of first wirings; applying a second voltage lower than the first voltage to a plurality of non-selected first wirings adjacent to the selected first wirings among the plurality of first wirings; applying a third voltage lower than the first voltage to a selected second wiring among the plurality of second wirings such that a voltage required to execute the forming operation to the variable resistance element is applied between the selected first wirings and the selected second wiring; applying a fourth voltage higher than the third voltage to a plurality of non-selected second wirings among the plurality of second wirings so as not to cause the forming operation of the variable resistance element and a change in the resistance value of the variable resistance element between the first wirings and the non-selected second wirings; and changing the plurality of selected first wirings to a floating state, with the plurality of non-selected first wirings maintained at the second voltage, when the third voltage is applied to the selected second wiring.

DETAILED DESCRIPTION OF THE EMBODIMENTS

Embodiments of the present invention are now described in detail with reference to the accompanying drawings.

First Embodiment

Figure 1:
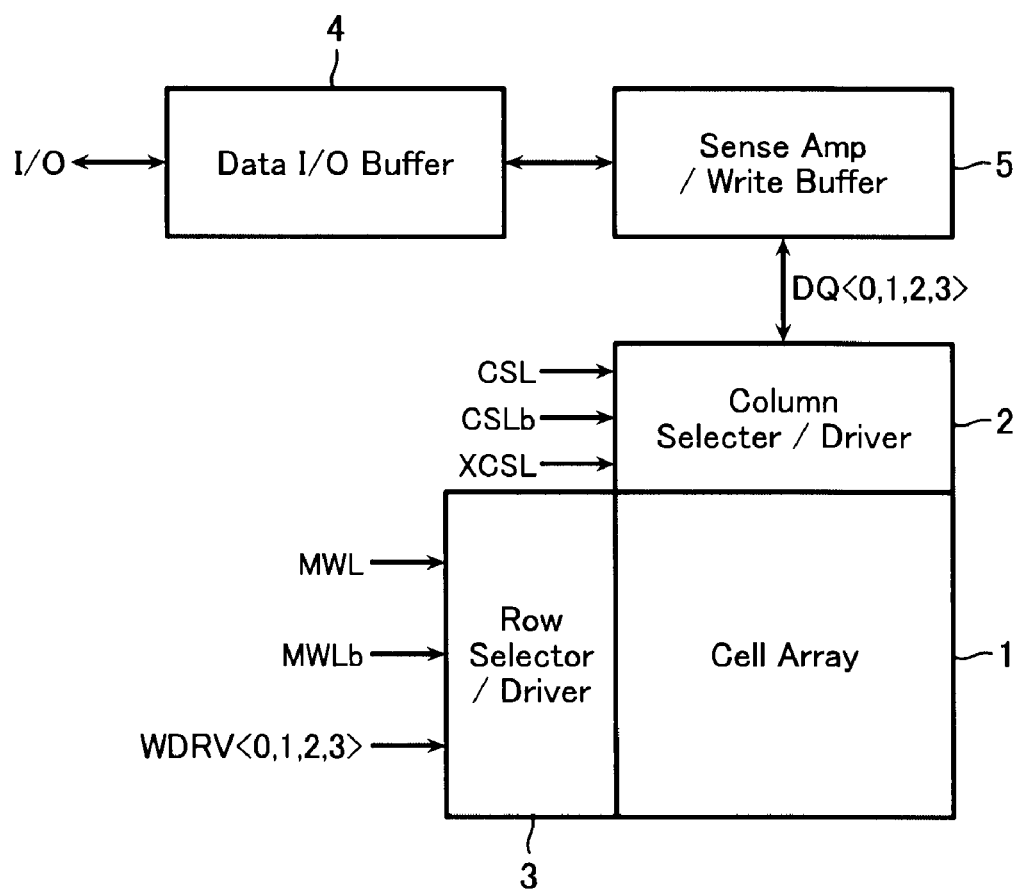
FIG. 1 is a block diagram illustrating a non-volatile semiconductor memory device according to a first embodiment of the present invention.

FIG. 1 is a block diagram illustrating a non-volatile semiconductor memory device according to a first embodiment of the present invention. FIG. 1 shows a main part of one memory block in the non-volatile semiconductor memory device. In the non-volatile semiconductor device, plural memory blocks are arranged in a matrix. One memory block includes a memory cell array 1 in which memory cells are arranged in a matrix. The memory cell array 1 may have a multi-layer structure. The memory cell array 1 includes a column selector/driver 2 that selects and drives bit lines BL based on the output signal of an address decoder (not shown) and a row selector/driver 3 that selects and drives word lines WL based on the output signal of the address decoder.

A data input/output buffer 4 is connected to an external host device (not shown) through I/O lines. The data input/output buffer 4 receives write data, an erase command, address data, and command data and outputs read data. The data input/output buffer 4 transmits the received write data to a sense amplifier/write buffer 5, receives read data from the sense amplifier/write buffer 5, and outputs the received data to the outside. The sense amplifier/write buffer 5 outputs write data DQ<0, 1, 2, 3> received from the data input/output buffer 4 to a selected bit line BL, senses the read data from the selected bit line BL, and outputs it to the data input/output buffer 4.

In addition, a voltage generating circuit (not shown) supplies voltages VWR and VUB required to execute a forming operation of a variable resistance element to the column selector/driver 2, and supplies voltages VUX, VSS, and WDRV<0, 1, 2, 3> to the row selector/driver 3.

Peripheral circuit elements other than the memory cell array 1 may be formed on a silicon substrate provided immediately beneath the memory cell array 1. In this case, the chip area of the semiconductor memory device may be substantially equal to the area of the memory cell array 1.

Figure 2:
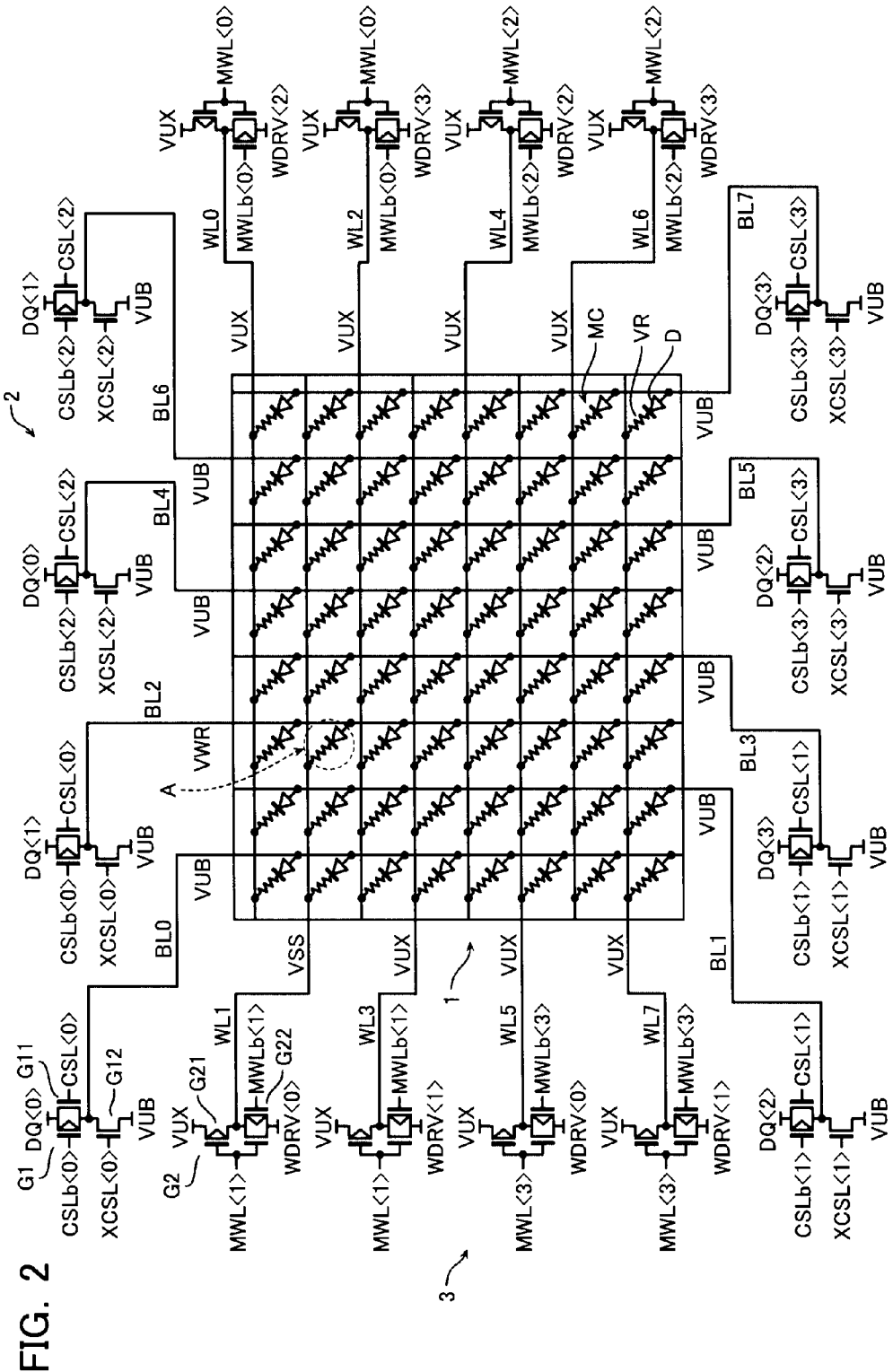
FIG. 2 is a circuit diagram illustrating a memory cell array and circuits around the memory cell array of the non-volatile semiconductor memory device according to the first embodiment.

FIG. 2 is a circuit diagram illustrating the memory cell array 1 and portions of the column selector/driver 2 and the row selector/driver 3 provided around the memory cell array 1. The memory cell array 1 includes bit lines BL0 to BL7 and word lines WL0 to WL7, which are first and second wirings intersecting each other, and plural memory cells MC connected to the intersections of the bit lines BL0 to BL7 and the word lines WL0 to WL7. Each of the memory cells MC includes a diode D, which is a non-ohmic element, and a variable resistance element VR connected in series to each other.

The column selector/driver 2 includes a gate G1 in which a transfer gate G11 and an NMOS transistor G12 for selecting each bit line BL are connected in series to each other. The transfer gate G11 may be independently controlled by column selection signals CSL<i> and CSLb<i> (i is 0 to 3, which is the same as below), and the NMOS transistor G12 may be independently controlled by a column selection signal XCSL<i>. In this embodiment, the gate G1 can multiple-select at least two data DQ<i> from the sense amplifier/write buffer 5.

The row selector/driver 3 includes a gate G2 in which a PMOS transistor G21 and a transfer gate G22 for selecting each word line WL are connected in series to each other. The gate G2 is controlled by row selection signals MWL<i> and MWLb<i>. In this embodiment, the gate G2 can multiple-select at least two drive voltages WDRV<i>.

The memory cell array 1 is formed as a cross-point device having a multi-layer structure on, for example, a silicon substrate (not shown). The bit line BL and the word line WL may be made of a material with a high heat resistance and a low resistance value, such as W, WSi, NiSi, or CoSi.

The variable resistance elements VR, which have, for example, a structure of electrode/transition metal oxide (binary system or ternary system)/electrode, provide a change in resistance value of a metal oxide depending on the conditions of applied voltage, current, heat, etc., and store the different states of the resistance values as information in a non-volatile manner. The variable resistance elements VR is divided broadly into two types: one is the type where a resistance change occurs depending on the absence or presence of electric charges trapped by a charge trapping residing on the electrode interface; and the other is the type where a resistance change occurs depending on the absence or presence of a conductive path due to oxygen defect, etc. More specifically, memory layer may be formed of material represented by a chemical formula $A_xM_yX_z$ (A and M are different elements) and having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), a perovskite structure ($AMO_3$) or the like.

The memory cell array 1 shown in FIG. 2 is the unipolar type which enables the setting of a high resistance state and a low resistance state by controlling the voltage values and the voltage application time, without switching the polarity of the applied voltage. For unipolar-type ReRAM, data write to a memory cell MC, that is, set operation is performed by applying, for on the order of 10 ns to 100 ns, a voltage of, e.g., 1.5 V (in fact, on the order of 2.1 V if a voltage drop 0.6 V in the corresponding diode D is included) and a current of on the order of 10 nA to a variable resistance element VR. When a high voltage is applied to the variable resistance element VR, internal cations (positive charge ions) move and a substance in an insulation state phase-changes to a series coupling state of electrochemically potentially (semi) stable conductive material. As a result, the variable resistance element VR changes from a high resistance state to a low resistance state.

On the other hand, data erase from a memory cell MC, that is, reset operation is performed by applying, for on the order of 500 ns to 2 µs, a voltage of 0.6 V (in fact, on the order of 1.6 V if a voltage drop 1.0 V in the corresponding diode D is included) and a current of on the order of 1 µA to 10 µA to a variable resistance element VR in its low resistance state after the set operation. When a low-voltage is applied to the variable resistance element VR for a long period of time, atoms are thermally diffused by Joule heat generated in the variable resistance element VR and change to an original thermal equilibrium state. As a result, the variable resistance element VR changes from a low resistance state to a high resistance state. It is needless to say that these models are examples and there are considered other models because various models exist depending on substances.

For example, a memory cell MC takes a high resistance state as a stable state (reset state). Data is written to the memory cell MC by such a set operation that causes a reset state to be switched to a low resistance state and data is erased from the memory cell MC by such a reset operation that causes a set state to be switched to a high resistance state for binary storage.

The variable resistance element VR is in a permanent high resistance state in which the resistance value thereof is not changed immediately after the resistive memory is manufactured. An operation (forming operation) of applying a predetermined voltage to the variable resistance element in the permanent high resistance state can be performed to render a resistance state of the variable resistance element VR capable of transition, and the variable resistance element VR functions as a memory element. A voltage VWR required for the forming operation is in the range of 5 V to 10 V, which is significantly higher than a set voltage. The forming operation is performed on a wafer before a wafer test process at the beginning of manufacture.

Next, a method of executing a forming operation to a variable resistance element VR according to this embodiment will be described.

Figure 3:
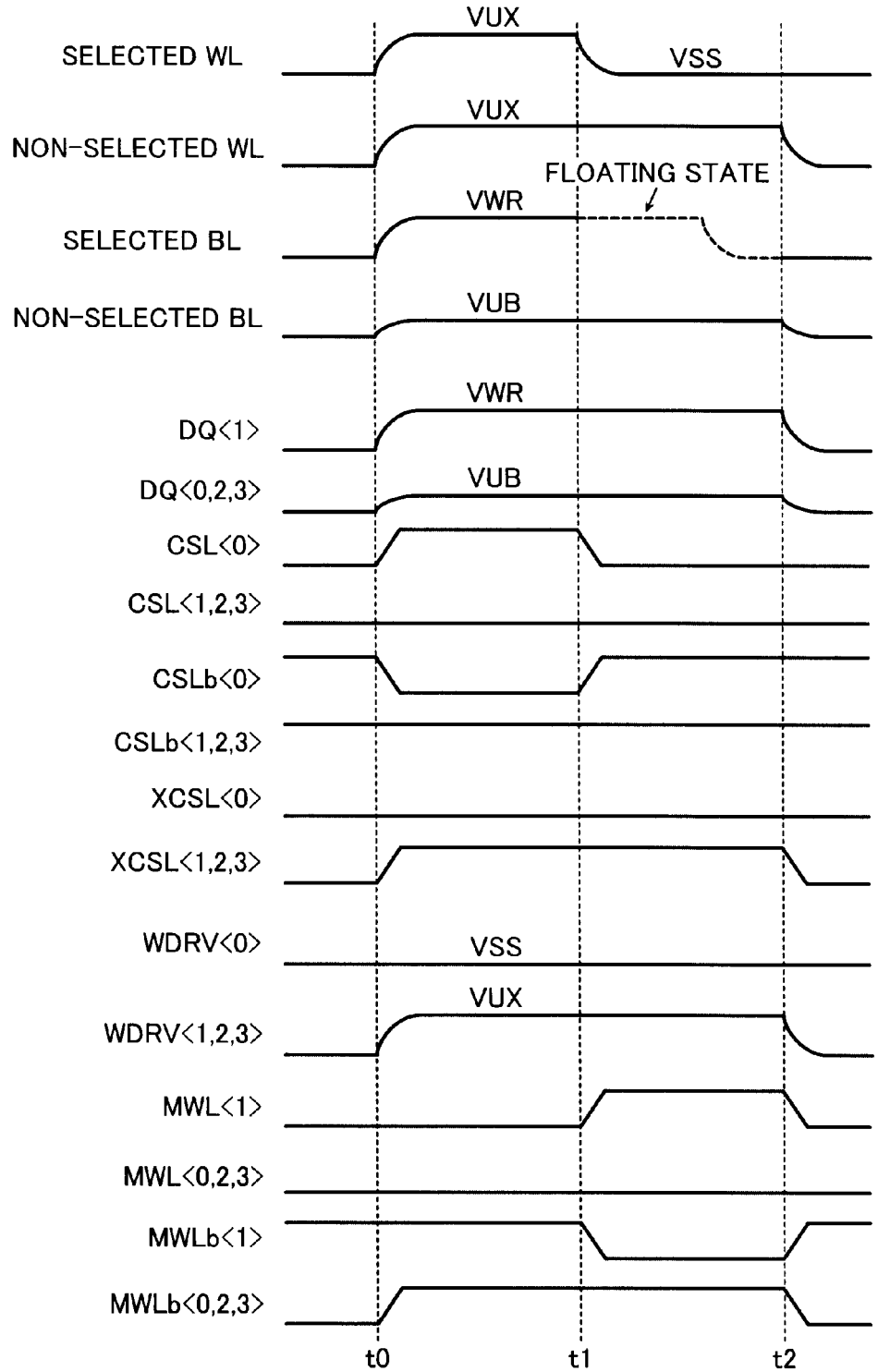
FIG. 3 is a diagram illustrating the waveforms of voltages applied to each unit according to the first embodiment.

In FIG. 2, when the forming operation is executed to the memory cell MC connected to the intersection of the bit line BL2 and the word line WL1 as a selected cell A, the voltage VWR required for executing the forming operation is applied only to the selected cell A. FIG. 3 is a diagram illustrating voltages applied to each unit during the forming operation.

First, at a time t0, only the column selection signals CSL<0> and CSLb<0> are activated in the column selector/driver 2. Then, data DQ<0> and DQ<1> are supplied to the bit lines BL0 and BL2. A first voltage VWR and a second voltage VUB are applied to the data DQ<0> and DQ<1>, respectively (when there are two write buffers). The first voltage VWR is a high voltage required for the forming operation, and the second voltage VUB is a low voltage that does not affect the variable resistance element VR. The column selection signal XCSL<1, 2, 3> is activated and the second voltage VUB is applied to the other non-selected bit lines BL1 and BL3 to BL7. Therefore, in the column selector/driver, only the selected bit line BL2 is precharged with the first voltage VWR, and the non-selected bit lines BL0, BL1, and BL3 to BL7 are precharged with the second voltage VUB. Meanwhile, all of the row selection signals MWL<i> and MWLb<i> are deactivated by the row selector/driver 3. Then, a fourth voltage VUX is applied to all of the word lines WL0 to WL7. The fourth voltage VUX is set such that the potential difference between the fourth voltage VUX and the first voltage VWR does not cause a variation in the resistance of the variable resistance element VR such as the forming, set, and reset operations.

Then, at a time t1, the column selection signals CSL<0> and CSLb<0> are deactivated, and the row selection signals MWL<1> and MWLb<1> are activated. Then, the bit lines BL0 and BL2 become a floating state, and only the selected word line WL1 is reduced to a third voltage VSS. As a result, the electrical charge in the selected bit line BL2 precharged with the first voltage VWR is discharged to the selected word line WL1 with the progress of the forming operation of the selected cell A, and the voltage of the selected bit line BL2 is reduced to a level substantially equal to VSS when the forming operation is completed. However, since a low voltage VUB is applied to the memory cell MC connected between the bit line BL0 and the word line WL1, there is no change in a resistance in the memory cell.

The period elapsed from the time t1 to a time t2 may be set so as to be longer than the longest one of the forming operation times of all the variable resistance elements VR. In this case, even when the times required to execute the forming operation to the variable resistance elements VR are different from each other, it is possible to reliably execute the forming operation to all the variable resistance elements VR.

Second Embodiment

Figure 4:
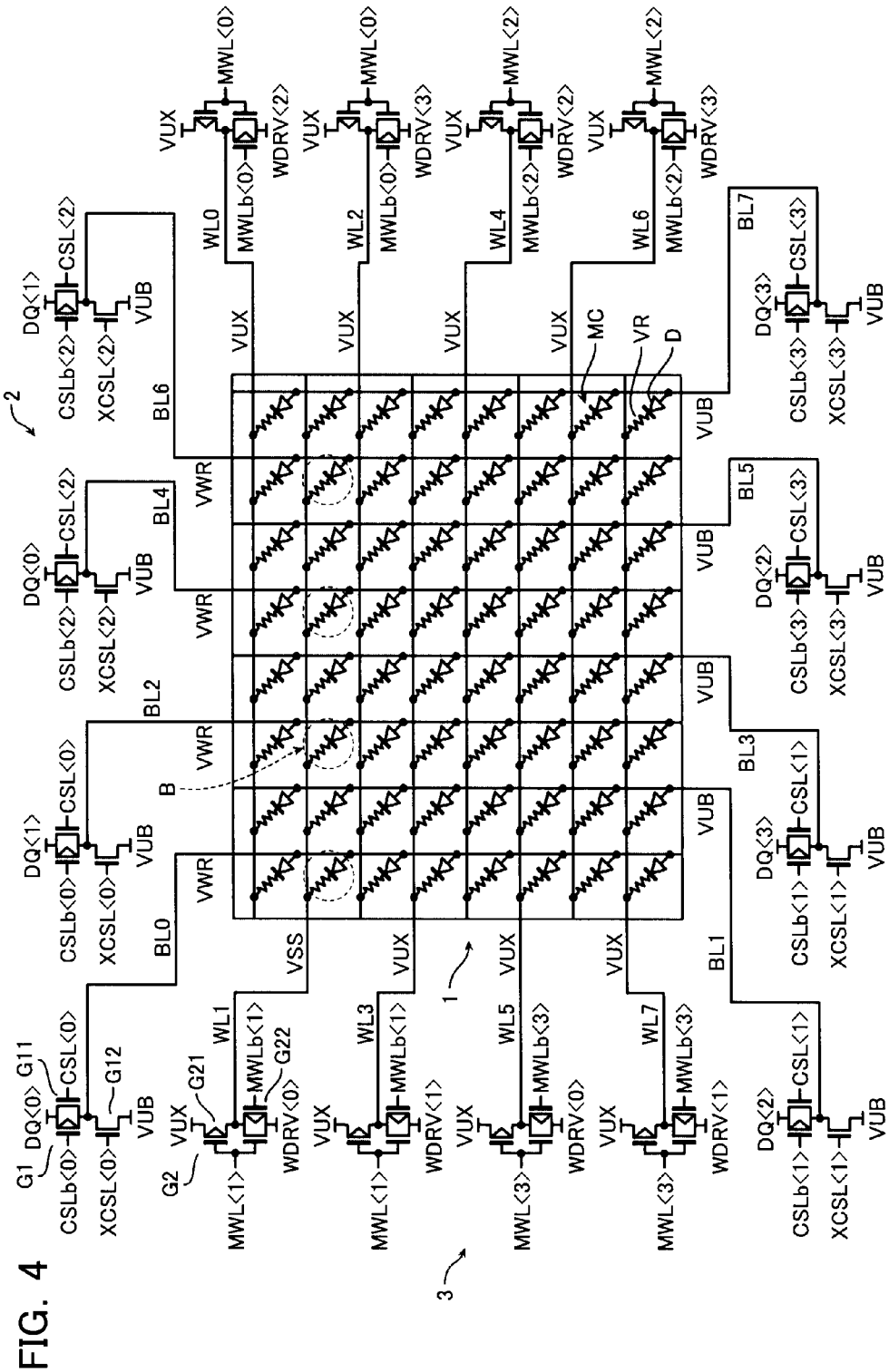
FIG. 4 is a circuit diagram illustrating a memory cell array and circuits around the memory cell array of a non-volatile semiconductor memory device according to a second embodiment of the present invention.

FIG. 4 is a circuit diagram illustrating a main part of a non-volatile semiconductor memory device according to a second embodiment of the present invention.

In the first embodiment, the variable resistance elements VR in one memory block are formed one by one. However, in the second embodiment, plural selected cells B connected to one word line WL are collectively formed.

Figure 5:
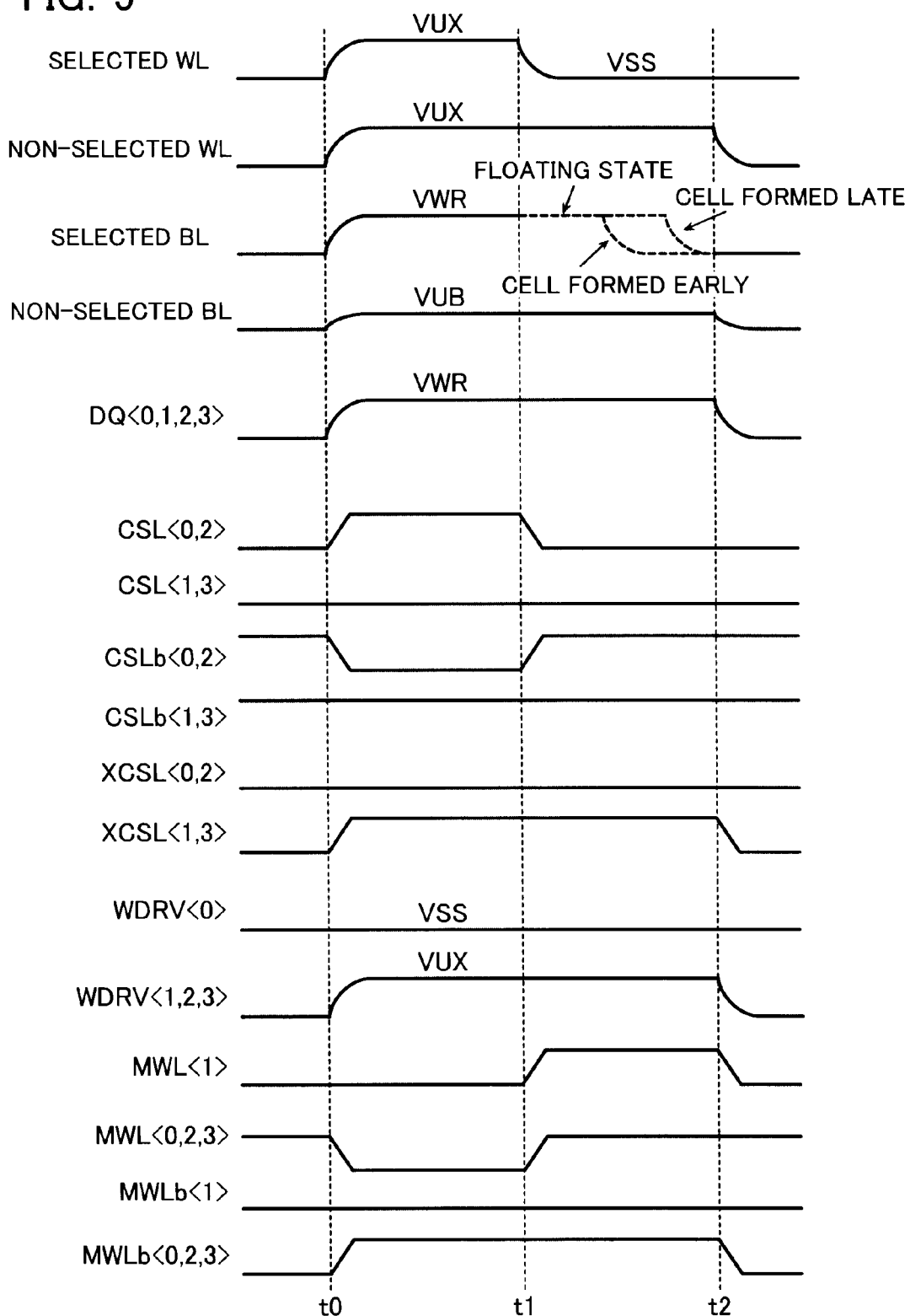
FIG. 5 is a diagram illustrating the waveforms of voltages applied to each unit according to the second embodiment.

FIG. 5 is a diagram illustrating the waveforms of voltages applied to each unit in the circuit shown in FIG. 4.

In this embodiment, at least one sense amplifier/write buffer 5 may be provided in one memory block. Generally, when the number of selected bit lines is M and the number of sense amplifier/write buffers is N, M>N is satisfied. The first voltage VWR is applied as the only data DQ supplied from the sense amplifier/write buffer 5 to the selected bit lines BL0, BL2, BL4, and BL6 by the multiple-selection of the gate G1. In addition, since the gate G1 is in a non-selected state, the second voltage VUB is applied to the non-selected bit lines BL1, BL3, BL5, and BL7. The voltage is applied to the word lines WL in the same way as that in the first embodiment.

According to the second embodiment, during the period from the time t1 to the time t2, half of the memory cells MC connected to the word line WL1, specifically, every other memory cells become the selected cells B, and the selected cells B are collectively performed a forming operation. Since the selected bit lines BL0, BL2, BL4, and BL6 are in a floating state, a reduction in the voltage of the selected bit lines depends on the time required to completely execute the forming operation to the memory cells MC connected to each bit line BL. If all the memory cells MC connected to the word line WL1 are collectively performed the forming operation, the potential of the bit line BL is changed by capacitive coupling between adjacent bit line BL that has been completed the forming operation, which causes a change in the potential of the bit lines. As a result, an erroneous forming operation is likely to occur.

In order to solve the problem, according to this embodiment, when the forming operation is performed by even-numbered bit lines BL0, BL2, BL4, and BL6, odd-numbered bit lines BL1, BL3, BL5, and BL7 adjacent to the even-numbered bit lines are fixed to the second voltage VUB, and the even-numbered bit lines are shielded. Therefore, a variation in the potential of each bit line does not affect other bit lines in a floating state. In addition, the capacitance between the bit lines is about 1 pF. When a current required for forming is 100 nA, the time required for a voltage drop of 0.1 V in the bit line BL in the floating state is about 1 μs. The time is sufficiently longer than several tens of nanoseconds, which is the time required to perform the forming operation to the variable resistance element VR. The bit line BL in the floating state does not affect the forming operation.

The time required to complete the forming operation varies depending on the variable resistance element. The method of applying a fixed voltage according to the related art has a problem in that it is difficult to execute a forming operation to plural variable resistance elements at the same time, which results in a reduction in throughput. In order to solve the problem, according to this embodiment, even when the times required to complete the forming operation are different from each plural selected cells, it is easy to collectively perform the forming operation to the selected cells since the voltage applied to the selected cells completed the forming operation is reduced. When one memory block is 16 Mb, the number of bit lines BL is 4000. Therefore, it is possible to perform the forming operation at a speed 2000 times higher than that in the method according to the related art.

Figure 6:
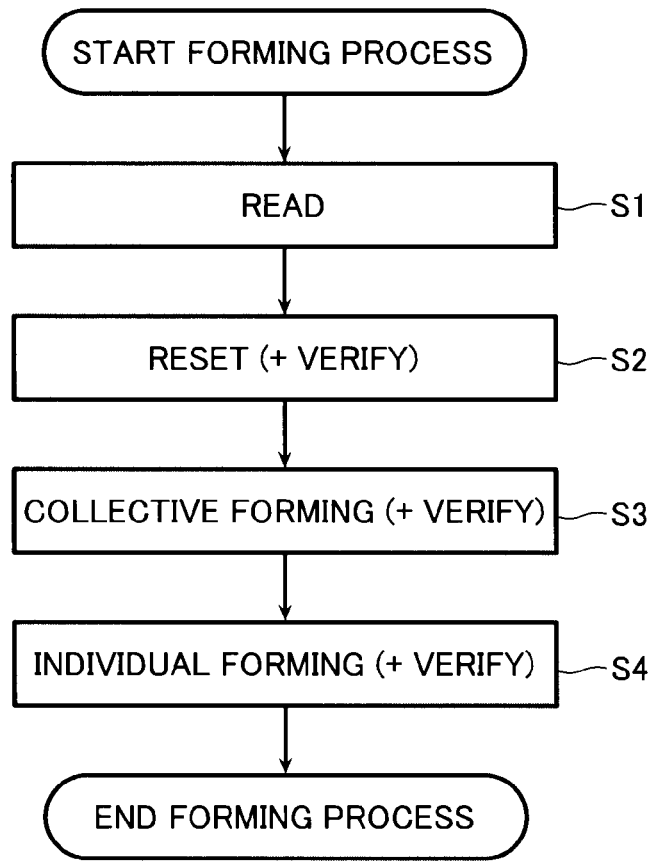
FIG. 6 is a flowchart illustrating a forming process according to the second embodiment.

FIG. 6 is a flowchart illustrating an actual forming process. In general, some memory cells are in a set state due to, for example, heat in a manufacturing process before the forming operation is performed. When the voltage required for forming operation is applied to the memory cells in the set state, an excessively high voltage is applied to the memory cells in the low resistance state. As a result, the memory cells are likely to be broken.

In order to solve the problem, first, a read operation is performed (S1). Then, when data read from a memory cell indicate that the memory cell is in the set state, reset operation is performed to the memory cell (S2). In this way, all the memory cells are changed to the high resistance state. Then, the above-mentioned collective forming operation is performed (S3). When there are memory cells that have not been completed the forming operation, the same individual forming operation as that in the first embodiment is performed (S4). It is preferable that each of the reset operation, the collective forming operation, and the individual forming operation be accompanied with a verify operation.

Third Embodiment

Figure 7:
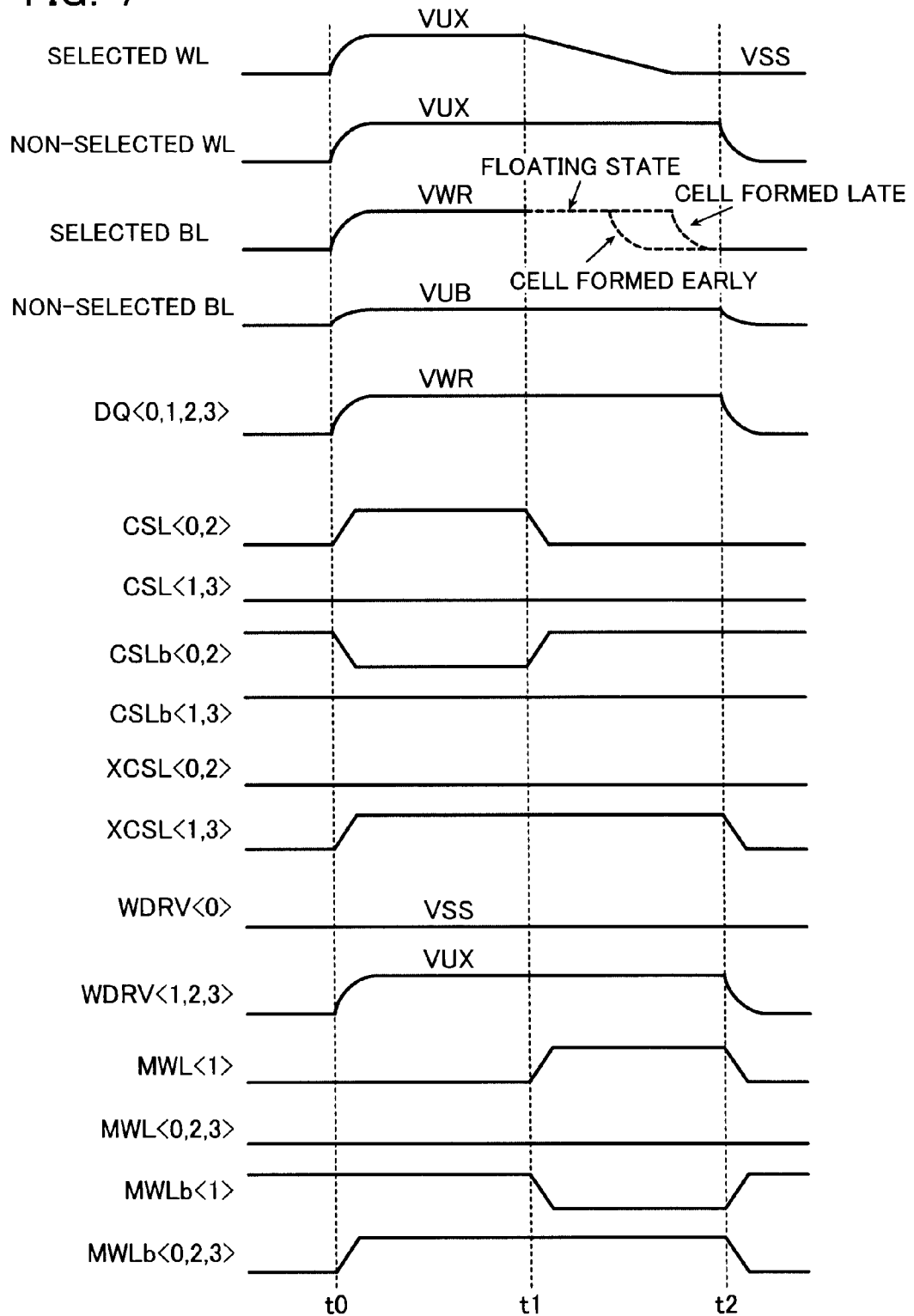
FIG. 7 is a diagram illustrating the waveforms of voltages applied to each unit according to a third embodiment of the present invention.

FIG. 7 is a diagram illustrating the waveforms of voltages applied to each unit according to a third embodiment of the present invention.

The third embodiment differs from the second embodiment in that, at the time t1 when the selected bit lines BL0, BL2, BL4, and BL6 are in the floating state, the selected word line WL is not directly changed from the fourth voltage VUX to the third voltage VSS, but electrical charge is slowly drawn out from the fourth voltage VUX to the third voltage VSS.

Figure 8:
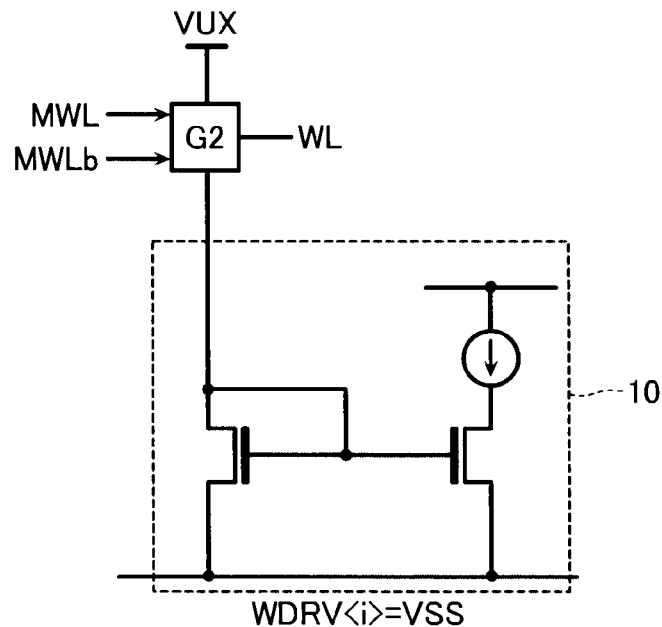
FIG. 8 is a circuit diagram illustrating a current-limiting circuit according to the third embodiment.

In this embodiment, a current-limiting circuit 10 shown in FIG. 8 is connected between the gate G2 of the row selector/driver 3 and a supply terminal for the third voltage VSS.

According to this embodiment, since the voltage applied to the selected cell is gradually increased, a low voltage is applied to the selected cell in which the forming operation is completed early. Therefore, it is possible to reduce the voltage stress as a whole applied to the selected cell and thus further improve yield.

Fourth Embodiment

Figure 9:
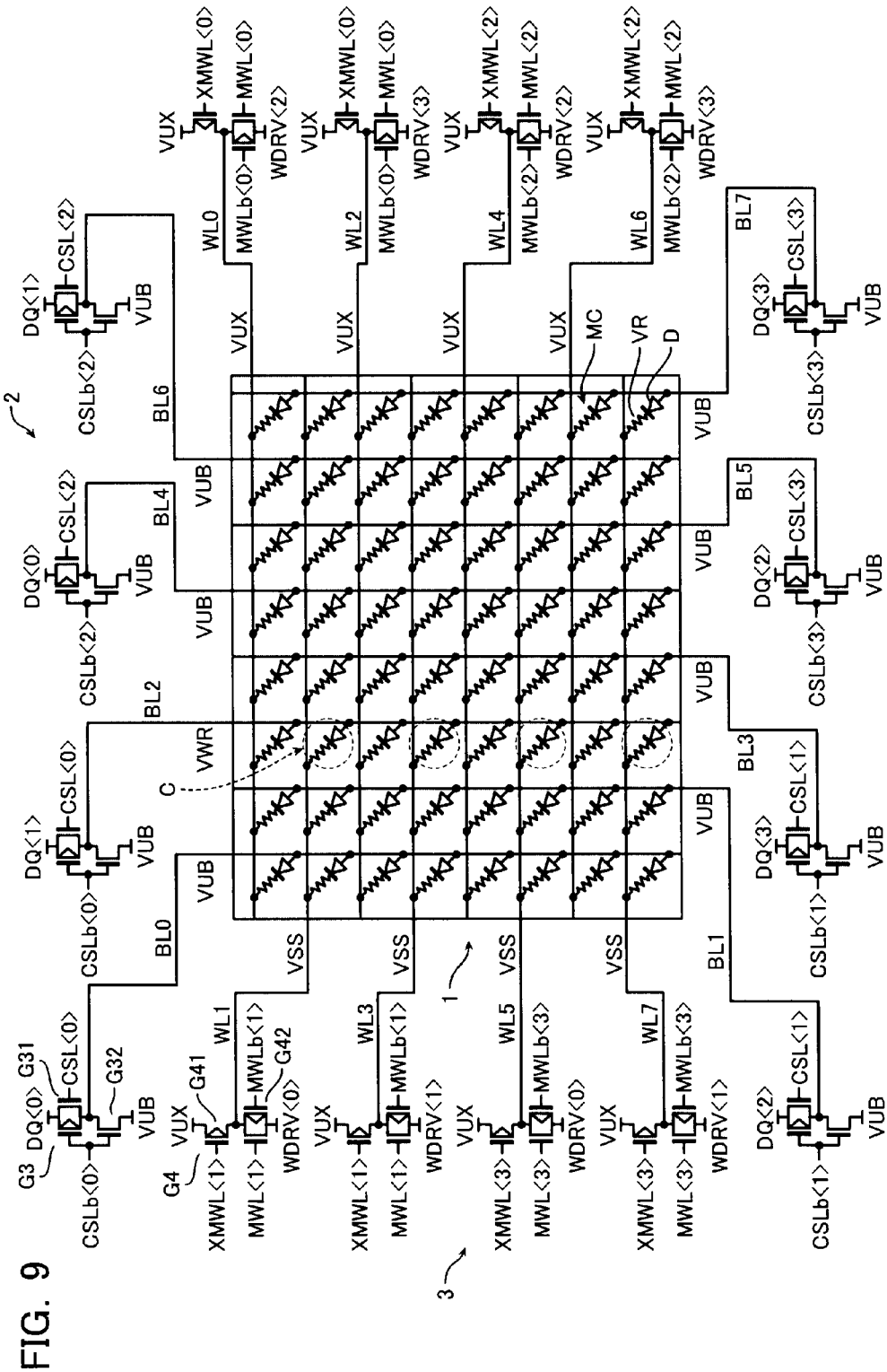
FIG. 9 is a circuit diagram illustrating a memory cell array and circuits around the memory cell array of a non-volatile semiconductor memory device according to a fourth embodiment of the present invention.

FIG. 9 is a circuit diagram illustrating a memory cell array 1 and portions of a column selector/driver 2 and a row selector/driver 3 provided around the memory cell array 1 according to a fourth embodiment of the present invention. In the second embodiment, plural memory cells connected to one word line WL are collectively performed a forming operation as the selected cells B. However, in the fourth embodiment, plural memory cells connected to one bit line BL are collectively performed a forming operation as selected cells C. In this case, unlike the first to third embodiments, the word line WL is the first wiring, and the bit line BL is the second wiring.

The column selector/driver 2 includes a gate G3 in which a transfer gate G31 and an NMOS transistor G32 for selecting each bit line BL are connected in series to each other. The gate G3 is controlled by the column selection signals CSL<i> and CSLb<i>.

Meanwhile, the row selector/driver 3 includes a gate G4 in which a PMOS transistor G41 and a transfer gate G42 for selecting each word line WL are connected in series to each other. The PMOS transistor G41 can be independently controlled by the row selection signal XMWL<i>, and the transfer gate G42 can be independently controlled by the row selection signals MWL<i> and MWLb<i> (i is 0 to 3, which is the same as below).

Figure 10:
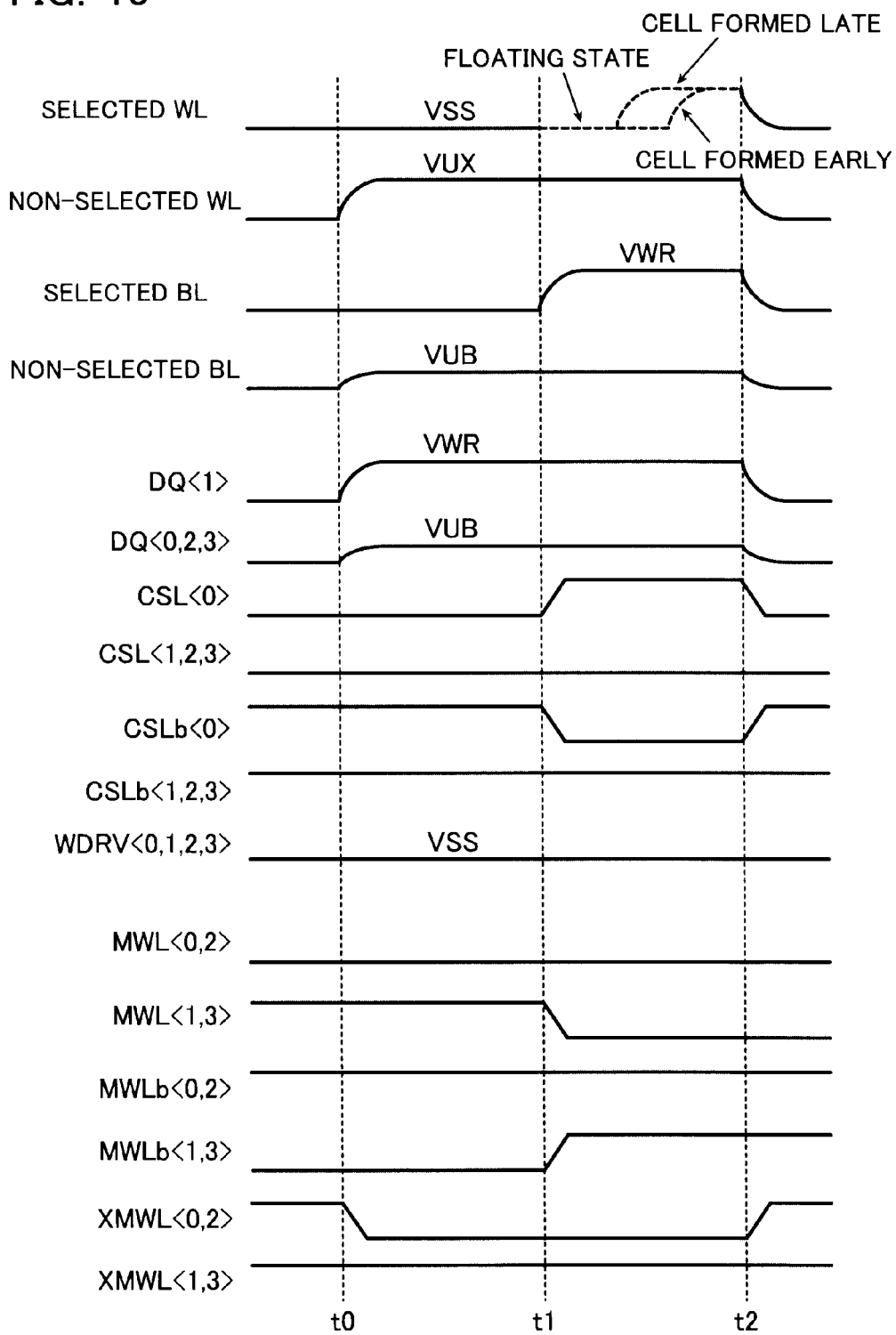
FIG. 10 is a diagram illustrating the waveforms of voltages applied to each unit according to the fourth embodiment.

In this embodiment, as shown in FIG. 10, at a time t1, the voltage VSS is applied to the selected word lines WL1, WL3, WL5, and WL7 and the voltage VUX is applied to the non-selected word lines WL0, WL2, WL4, and WL6. The voltage of the selected bit line BL2 is changed from the voltage VSS to the first voltage VWR at the time t1. At the same time, the selected word line WL becomes a floating state. The word line WL to which the variable resistance elements VR completing the forming operation are connected is charged with the voltage VWR. However, since adjacent word lines WL are fixed to the voltage VUX, the other word lines WL are not affected by the shield effect.

What is claimed is:

1. A method of executing a forming operation to variable resistance elements each provided between one of a plurality of first wirings and one of a plurality of second wirings, respectively, the forming operation to render the variable resistance element capable of transitioning its resistance value, the method comprising:
applying a required voltage between the first and second wirings and changing the first wiring to a floating state,
wherein the applying the required voltage includes:
applying a first voltage to a selected first wiring, the selected first wiring being one of the first wirings,
applying a second voltage lower than the first voltage to a non-selected first wiring, the non-selected first wiring being another one of the first wirings,
applying a third voltage lower than the first voltage to a selected second wiring such that the required voltage to execute the forming operation to the variable resistance element is applied between the selected first wiring and the selected second wiring, the selected second wiring being one of the second wirings, and
changing the selected first wiring to the floating state when the third voltage is applied to the selected second wiring.

2. The method of executing a forming operation to variable resistance elements according to claim 1,
further comprising precharging the second wirings to a fourth voltage that does not cause the forming operation of the variable resistance element and a change in the resistance value of the variable resistance element between the first and second wirings, and then discharging the selected second wiring to the third voltage substantially at a same time as the selected first wiring is changed to the floating state.

3. A method of executing a forming operation to variable resistance elements each provided between one of a plurality of first wirings and one of a plurality of second wirings, respectively, the forming operation to render the variable resistance element capable of transitioning its resistance value, the method comprising:
applying a required voltage between the first and second wirings and changing the first wiring to a floating state,
wherein, after a predetermined time has elapsed, further comprising discharging non-selected first wirings and non-selected second wirings to end the forming operation, and
wherein the predetermined time is set to be longer than a longest one of forming operation times of all the variable resistance elements.

4. A method of executing a forming operation to variable resistance elements each provided between one of a plurality of first wirings and one of a plurality of second wirings, respectively, the forming operation to render the variable resistance element capable of transitioning its resistance value, the method comprising:
applying a required voltage between the first and second wirings and changing the first wiring to a floating state,
wherein the applying the required voltage includes:
applying a first voltage to a selected second wiring, the selected second wiring being one of the second wirings,
applying a second voltage higher than the first voltage to a non-selected second wiring, the non-selected second wiring being another one of the second wirings,
applying, to a selected first wiring, a third voltage higher than the first voltage and allowing the required voltage to execute the forming operation to the variable resistance element to be applied between the selected first and second wirings, the selected first wiring being one of the first wirings, and
changing the selected second wiring to the floating state when the third voltage is applied to the selected first wiring.

5. A method of executing a forming operation to variable resistance elements in a non-volatile semiconductor memory device, the forming operation being an operation to render the variable resistance element capable of transitioning its resistance value, the non-volatile semiconductor memory device including a plurality of first wirings, a plurality of second wirings intersecting the first wirings, and a plurality of memory cells provided at intersections of the first and second wirings and connected between the first and second wirings, each of the memory cells including the variable resistance element which stores the resistance value as non-volatile data, the method comprising:
applying a first voltage to a plurality of selected first wirings among the plurality of first wirings;
applying a second voltage to a plurality of non-selected first wirings adjacent to the selected first wirings among the plurality of first wirings;
applying a third voltage to a selected second wiring among the plurality of second wirings such that a required voltage is applied between the selected first wirings and the selected second wiring;
applying a fourth voltage to a plurality of non-selected second wirings among the plurality of second wirings so as not to cause the forming operation of the variable resistance element and a change in the resistance value of the variable resistance element between the first wirings and the non-selected second wirings; and
changing the plurality of selected first wirings to a floating state, with the plurality of non-selected first wirings maintained at the second voltage, when the third voltage is applied to the selected second wiring.

6. The method of executing a forming operation to variable resistance elements according to claim 5,
further comprising precharging the plurality of second wirings to the fourth voltage, and then discharging the selected second wiring to the third voltage substantially at a same time as the selected first wirings are changed to the floating state.

7. The method of executing a forming operation to variable resistance elements according to claim 6,
further comprising controlling a discharge speed of the selected second wiring from the fourth voltage by a current-limiting circuit.

8. The method of executing a forming operation to variable resistance elements according to claim 5, wherein the plurality of first wirings, the plurality of second wirings, and the plurality of memory cells form a memory block, when the number of write buffers connected to the memory block is N and the number of selected first wirings is M, M>N is satisfied, the plurality of selected first wirings is a multiple selected by the write buffer and the selected first wirings are precharged with the first voltage, and a gate of a selection driver connected to the selected first wirings is turned off to change the M selected first wirings to the floating state.

9. The method of executing a forming operation to variable resistance elements according to claim 5, wherein the plurality of first wirings, the plurality of second wirings, and the plurality of memory cells form a memory block, and every other the first wiring in the memory block is selected as the plurality of selected first wirings.

10. The method of executing a forming operation to variable resistance elements according to claim 5, further comprising performing a read operation on the memory cells before the forming operation of the variable resistance element.

11. The method of executing a forming operation to variable resistance elements according to claim 10, wherein, when it is detected by the read operation that the memory cell is in a low resistance state, further comprising performing the forming operation of the variable resistance element after the memory cell is changed to a high resistance state.

12. The method of executing a forming operation to variable resistance elements according to claim 5, wherein, after the voltages are completely applied to the plurality of first wirings and the plurality of second wirings, further comprising performing a verify operation of reading the resistance state of the memory cell, and when the variable resistance element is not formed, performing the forming operation of the variable resistance element again.

13. The method of executing a forming operation to variable resistance elements according to claim 5, wherein the first voltage is higher than the third voltage.

14. The method of executing a forming operation to variable resistance elements according to claim 5, wherein the third voltage is higher than the first voltage.

15. A method of executing a forming operation to variable resistance elements in a non-volatile semiconductor memory device, the forming operation being an operation to render the variable resistance element capable of transitioning its resistance value, the non-volatile semiconductor memory device including a plurality of first wirings, a plurality of second wirings intersecting the first wirings, and a plurality of memory cells provided at intersections of the first and second wirings and connected between the first and second wirings, each of the memory cells including the variable resistance element which stores the resistance value as non-volatile data, the method comprising:

applying a first voltage to a plurality of selected first wirings among the plurality of first wirings;

applying a second voltage lower than the first voltage to a plurality of non-selected first wirings adjacent to the selected first wirings among the plurality of first wirings;

applying a third voltage lower than the first voltage to a selected second wiring among the plurality of second wirings such that a required voltage is applied between the selected first wirings and the selected second wiring;

applying a fourth voltage higher than the third voltage to a plurality of non-selected second wirings among the plurality of second wirings so as not to cause the forming operation of the variable resistance element and a change in the resistance value of the variable resistance element between the first wirings and the non-selected second wirings; and changing the plurality of selected first wirings to a floating state, with the plurality of non-selected first wirings maintained at the second voltage, when the third voltage is applied to the selected second wiring.

16. The method of executing a forming operation to variable resistance elements according to claim 15, further comprising precharging the plurality of second wirings to the fourth voltage, discharging the selected second wiring to the third voltage substantially at a same time as the selected first wirings are changed to the floating state.

17. The method of executing a forming operation to variable resistance elements according to claim 16, further comprising controlling a discharge speed of the selected second wiring from the fourth voltage by a current-limiting circuit.

18. The method of executing a forming operation to variable resistance elements according to claim 15, wherein the plurality of first wirings, the plurality of second wirings, and the plurality of memory cells form a memory block, when the number of write buffers connected to the memory block is N and the number of selected first wirings is M, M>N is satisfied, the plurality of selected first wirings is a multiple selected by the write buffer and the selected first wirings are precharged with the first voltage, and a gate of a selection driver connected to the selected first wirings is turned off to change the M selected first wirings to the floating state.

* * * * *